(12) United States Patent
Ishikawa et al.

(10) Patent No.: US 9,106,237 B2
(45) Date of Patent: Aug. 11, 2015

(54) OSCILLATION CIRCUIT, ELECTRONIC APPARATUS, AND MOVING OBJECT

(71) Applicant: Seiko Epson Corporation, Tokyo (JP)

(72) Inventors: Masayuki Ishikawa, Suwa (JP);
Takehiro Yamamoto, Suwa (JP);
Yosuke Itasaka, Chino (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 14/034,934

(22) Filed: Sep. 24, 2013

(65) Prior Publication Data

US 2014/0091865 A1 Apr. 3, 2014

(30) Foreign Application Priority Data

Sep. 28, 2012 (JP) .................. 2012-215932

(51) Int. Cl.
*H03B 5/32* (2006.01)
*H03L 7/16* (2006.01)
*H03B 5/36* (2006.01)
*H03B 1/00* (2006.01)
*H03L 1/02* (2006.01)

(52) U.S. Cl.
CPC .. *H03L 7/16* (2013.01); *H03B 1/00* (2013.01); *H03B 5/36* (2013.01); *H03B 5/364* (2013.01); *H03L 1/023* (2013.01)

(58) Field of Classification Search
CPC .................................. H03B 5/36; H03B 1/00
USPC ...................... 331/177 V, 158, 116 FE, 116 R
See application file for complete search history.

(56) References Cited

U.S. PATENT DOCUMENTS

| | | | |
|---|---|---|---|
| 6,040,744 | A | 3/2000 | Sakurai et al. |
| 6,239,662 | B1 | 5/2001 | Fukayama et al. |
| 6,559,730 | B1 | 5/2003 | Marvin et al. |
| 6,788,159 | B2 | 9/2004 | Takahashi et al. |
| 7,212,076 | B1 | 5/2007 | Taheri et al. |
| 7,986,194 | B2 | 7/2011 | Kiyohara et al. |
| 2002/0180544 | A1 | 12/2002 | Fukayama et al. |
| 2006/0208816 | A1 | 9/2006 | Ohshima et al. |
| 2008/0309424 | A1* | 12/2008 | Shen et al. ............ 331/158 |
| 2009/0039970 | A1 | 2/2009 | Shen et al. |

(Continued)

FOREIGN PATENT DOCUMENTS

| | | |
|---|---|---|
| JP | 09-102714 A | 4/1997 |
| JP | 11-088052 A | 3/1999 |

(Continued)

*Primary Examiner* — Arnold Kinkead
(74) *Attorney, Agent, or Firm* — Harness, Dickey & Pierce, P.L.C.

(57) ABSTRACT

An oscillation circuit is connected to a resonator element (crystal resonator) and oscillates a resonator element to output an oscillation signal. The oscillation circuit includes an amplification element (inverter), and a set of variable capacitive elements having at least two variable capacitive elements, which are connected to an oscillation loop from an output to an input of the amplification element and the capacitance values thereof are controlled with potential differences between reference voltages and a variable control voltage. In each variable capacitive element of a set of variable capacitive elements, the common control voltage is applied to one terminal, and the reference voltage which differs between the variable capacitive elements is input to the other terminal.

9 Claims, 16 Drawing Sheets

(56) References Cited

U.S. PATENT DOCUMENTS

2014/0091868 A1* 4/2014 Ishikawa et al. ........ 331/107 DP
2014/0091872 A1* 4/2014 Itasaka ............................ 331/36

FOREIGN PATENT DOCUMENTS

| JP | 2007-019565 A | 1/2007 |
| WO | WO-2005-046046 A1 | 5/2005 |

* cited by examiner

OSCILLATION CIRCUIT, ELECTRONIC APPARATUS, AND MOVING OBJECT

BACKGROUND

1. Technical Field

The present invention relates to an oscillation circuit, an electronic apparatus, a moving object, and the like.

2. Related Art

In order to make a frequency of an oscillation circuit variable, a method in which a voltage is applied to a variable capacitive element arranged in the oscillation circuit to change capacitance is known. An oscillator which controls a frequency with voltage is generally called a voltage controlled X'tal oscillator (VCXO). As an oscillator in which a frequency deviation is suppressed with respect to temperature using this principle, a temperature compensated X'tal oscillator (TCXO) is known.

In a discrete oscillator, although a variable capacitive element having a large change in capacitance is selected to constitute a circuit, when implementing an oscillation circuit in the form of an integrated circuit, the characteristics of usable variable capacitive elements are limited. That is, if an oscillation circuit is implemented in the form of an integrated circuit, in general, a variable capacitive element has a smaller change in capacitance than a discrete variable capacitive element. This is because a dedicated process is required in order to obtain a large change in capacitance.

In recent years, reduction in size of a crystal oscillator is demanded, and implementation of an oscillation circuit in the form of an integrated circuit is in progress. However, when an integrated circuit is used, the variable amount of a usable variable capacitive element is limited, and thus there is a problem in that a necessary frequency variable width or linearity is not obtained.

In JP-A-2007-19565, a single control voltage which is applied to two variable capacitive elements is divided halfway by two level shift circuits, given a potential difference, and then applied to the variable capacitive elements. At this time, a configuration is made such that the C-V characteristic of one variable capacitive element is linear in a region lower than the center voltage of the control voltage, and the C-V characteristic of the other variable capacitive element is linear in a region higher than the center voltage of the control voltage. For this reason, it is possible to allow the control voltage to vary in a wider range than the related art while securing linearity and to obtain a necessary frequency variable width.

However, in JP-A-2007-19565, a plurality of level shift circuits are required for each control voltage. For example, in the TCXO, a plurality of kinds of control voltages are used in order to increase compensation precision. At this time, level shift circuits corresponding to the number obtained by multiplying the number of kinds are required. Accordingly, when the method disclosed in JP-A-2007-19565 is applied to the TCXO, circuit scale and power consumption tend to increase.

SUMMARY

An advantage of some aspects of the invention is to provide an oscillation circuit, an electronic apparatus, a moving object, and the like capable of expanding a variable width of capacitance while securing linearity of change in capacitance of a variable capacitive element with respect to change in control voltage, thereby securing linearity of change in frequency with respect to change in control voltage to expand a frequency variable width and suppressing an increase in circuit scale and power consumption.

The invention can be implemented as the following forms or application examples.

APPLICATION EXAMPLE 1

This application example is directed to an oscillation circuit which is connected to a resonatoer element and oscillates the resonator element to output an oscillation signal. The oscillation circuit includes an amplification element, and a set of variable capacitive elements having at least two variable capacitive elements, which are connected to an oscillation loop from an output to an input of the amplification element and the capacitance values of which are controlled with potential differences between reference voltages and a variable control voltage. In each variable capacitive element of the set of variable capacitive elements, the common control voltage is applied to one terminal, and the reference voltage which differs between the variable capacitive elements is applied to the other terminal.

The oscillation circuit according to this application example includes the amplification element which amplifies a signal from the resonator element connected thereto, and the set of variable capacitive elements having at least two variable capacitive elements, which are connected to the oscillation loop from the output to the input of the amplification element and the capacitance values of which are controlled with the potential differences between the reference voltages and the variable control voltage. The set of variable capacitive elements may be expressed as a group of variable capacitive elements or a variable capacitive element group.

As the amplification element, a bipolar transistor, a field effect transistor (FET), a metal oxide semiconductor field effect transistor (MOSFET), or the like may be used. As the resonator element, for example, a surface acoustic wave (SAW) resonator, an AT cut crystal resonator, an SC cut crystal resonator, a tuning fork crystal resonator, other piezoelectric resonators, a micro electro mechanical systems (MEMS) vibrator, or the like may be used. The set of variable capacitive elements are connected to the oscillation loop from the output to the input of the amplification element, and the frequency of the oscillation signal changes with change in capacitance of the variable capacitive elements.

At this time, each variable capacitive element has a first wiring and a second wiring. The control voltage as a common voltage is applied to the first wiring, and the reference voltage which differs between the variable capacitive elements is applied to the second wiring. For example, in each variable capacitive element, the control voltage is applied to one end, and the reference voltage is applied to the other end.

Since the potential difference (the difference between the control voltage applied to the first wiring and the reference voltage applied to the second wiring) differs between the variable capacitive elements, it is possible to expand the variable width of capacitance while securing linearity of change in capacitance of the set of variable capacitive elements. For this reason, it is possible to secure linearity of change in frequency with respect to change in control voltage, thereby expanding the frequency variable width. At this time, since a level shift circuit is not required, it is possible to suppress an increase in circuit scale and power consumption.

APPLICATION EXAMPLE 2

The oscillation circuit according to the application example described above may be configured such that the oscillation circuit has a function of adjusting the reference voltages.

The oscillation circuit according to this application example may have a function of adjusting the reference voltages. The function of adjusting the reference voltages can be realized by a resistance division circuit including variable resistance or the like, and there is a method which individually adjusts a plurality of different reference voltages, or a method which offsets a plurality of reference voltages by the same voltage. At this time, adjustment is made such that variable sensitivity of the set of variable capacitive elements is flat (for example, a state where change in frequency of the oscillation signal is unbiased with respect to change in control voltage), that is, more excellent linearity is exhibited.

APPLICATION EXAMPLE 3

The oscillation circuit according to the application example described above may be configured such that the variable capacitive elements includes a MOS variable capacitive element.

With the oscillation circuit according to this application example, a variable capacitance circuit includes a MOS variable capacitive element. The metal oxide semiconductor (MOS) variable capacitive element is a variable capacitive element (hereinafter, referred to as a varactor) having a structure of a metal oxide semiconductor. For this reason, it is possible to realize the oscillation circuit according to this application example as a semiconductor integrated circuit.

APPLICATION EXAMPLE 4

The oscillation circuit according to the application example described above may be configured such that the oscillation circuits includes a plurality of sets of variable capacitive elements, and the control voltage differs between the sets of variable capacitive elements.

With the oscillation circuit according to this application example, the control voltage which is applied to the first wiring differs between a plurality of sets of variable capacitive elements. The reference voltage which is applied to the second wiring differs between the variable capacitive elements of each set of variable capacitive elements.

For example, in the TCXO, since a plurality of kinds of control voltages (as a specific example, three kinds of control voltages for external control, temperature compensation, and frequency offset) are used in order to increase compensation precision, as in JP-A-2007-19565, a level shift circuit is not required, thereby avoiding an increase in circuit scale and power consumption.

APPLICATION EXAMPLE 5

The oscillation circuit according to the application example described above may be configured such that at least one set of variable capacitive elements from among a plurality of sets of variable capacitive elements is a set of minimum sensitivity variable capacitive elements having smallest change in capacitance with respect to change in voltage compared to other sets of variable capacitive element.

With the oscillation circuit according to this application example, one set of variable capacitive elements can be handled distinctively according to purposes. For example, sensitivity of change in capacitance with respect to change in voltage of a variable capacitive element may be low for a specific purpose compared to other purposes. In this case, a set of minimum sensitivity variable capacitive elements which is one set of variable capacitive elements from among a plurality of sets of variable capacitive elements is set, and capacitance sensitivity of the set of minimum sensitivity variable capacitive elements is set to be lower than other sets of variable capacitive elements.

APPLICATION EXAMPLE 6

The oscillation circuit according to the application example described above may be configured such that the control voltage has a group of three kinds of voltages, and an intermediate voltage between the reference voltages of other sets of variable capacitive elements is used as the control voltage of the set of minimum sensitivity variable capacitive elements.

With the oscillation circuit according to this application example, as the control voltage of the set of minimum sensitivity variable capacitive elements, the intermediate voltage between the reference voltages of other two sets of variable capacitive elements is used, thereby making capacitance sensitivity of the set of minimum sensitivity variable capacitive elements lower than other sets of variable capacitive elements. At this time, since a circuit which generates a separate voltage is not required, it is possible to suppress an increase in circuit scale and power consumption. The control voltage and the reference voltages are supplied from the same voltage generation circuit, thereby avoiding the occurrence of large noise in the set of minimum sensitivity variable capacitive elements.

APPLICATION EXAMPLE 7

This application example is directed to an electronic apparatus including the oscillation circuit according to the application example described above.

APPLICATION EXAMPLE 8

This application example is directed to a moving object including the oscillation circuit according to the application example.

The electronic apparatus and the moving object according to the application examples include the oscillation circuit capable of expanding the variable width while maintaining linearity of change in capacitance of the variable capacitive elements, and suppressing an increase in circuit scale and power consumption. For this reason, it is possible to realize an electronic apparatus and a moving object capable of obtaining a necessary frequency variable width and having user-friendliness.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
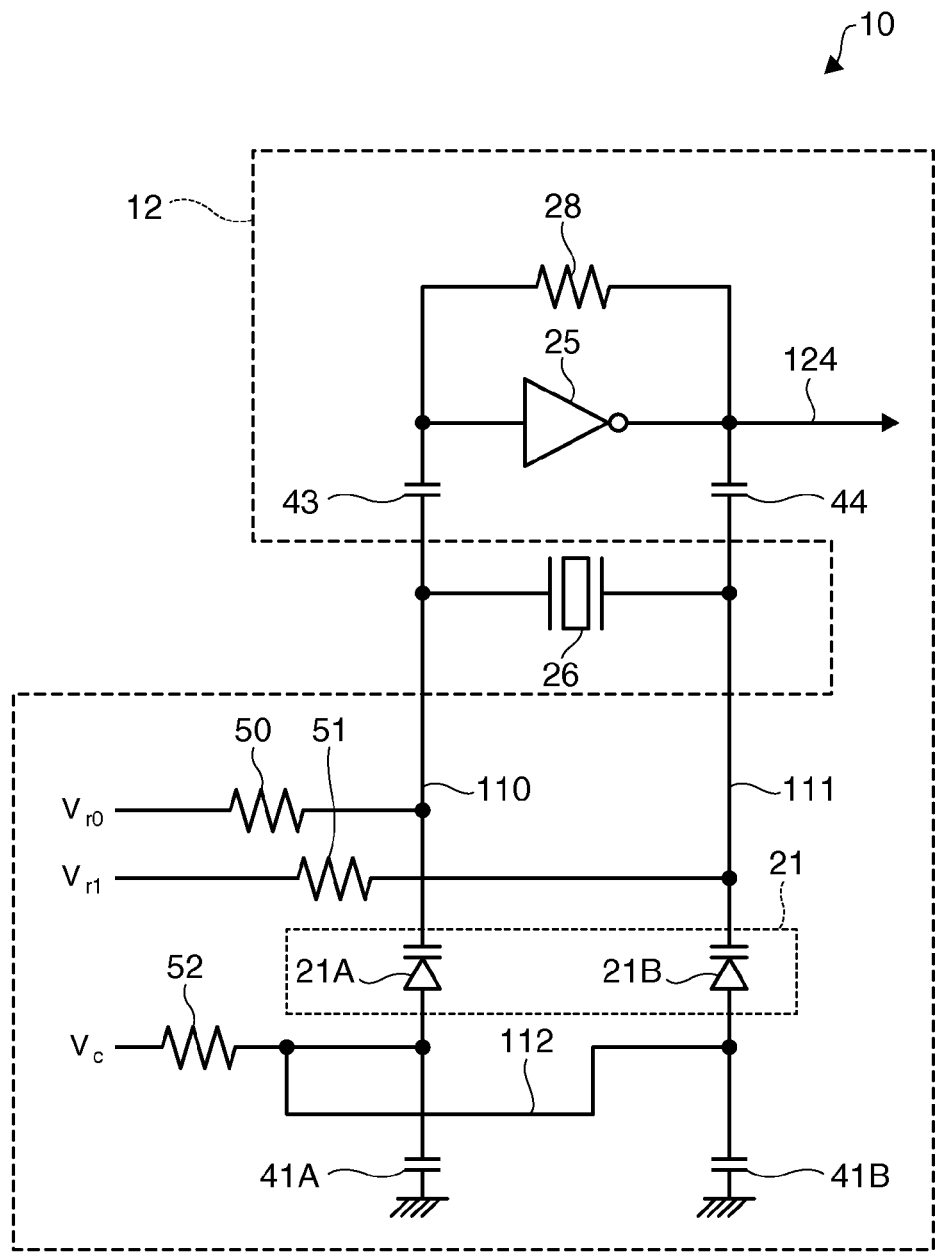
FIG. 1 is a diagram showing a configuration example of an oscillation circuit of a first embodiment.

Hereinafter, a preferred embodiment of the invention will be described in detail referring to the drawings. The following embodiments are not intended to unduly limit the content of the invention described in the appended claims. It is not always true that the entire configuration described below is the essential constituent requirement of the invention.

1. First Embodiment 1.1. Outline of Oscillation Circuit

FIG. 1 is a diagram showing a configuration example of an oscillation circuit 12 of a first embodiment. The oscillation circuit 12 of this embodiment forms a part of a temperature compensated X'tal oscillator (TCXO). In the oscillation circuit 12 of this embodiment, some of elements described below may be omitted or changed, or other elements may be added.

The oscillation circuit 12 of this embodiment includes a feedback resistor 28 and an inverter 25, and is connected to a crystal resonoator 26. The inverter 25 has a property to amplify an input signal, and corresponds to an amplification element according to the invention. The crystal resonator 26 corresponds to an resonator element according to the invention. As shown in FIG. 1, the oscillation circuit 12 is connected to the crystal resonator 26, and an oscillation loop is formed from an output to an input of the inverter 25. The oscillation circuit 12 amplifies a signal generated by the crystal resonator 26 using the inverter 25, and outputs an oscillation signal 124 as a clock pulse to be used in an external circuit, for example.

The oscillation circuit 12 is connected to the crystal resonator 26 to form a vibrating device 10 as an oscillator. That is, a portion of the vibrating device 10 excluding the crystal resonator 26 corresponds to the oscillation circuit 12. Accordingly, hereinafter, description of the vibrating device 10 may be referred to when describing the oscillation circuit 12 without any particular limitation.

In the oscillation circuit 12 of this embodiment, although DC cut capacitors 43 and 44 are provided in the oscillation loop, one or both of the DC cut capacitors 43 and 44 may be omitted.

The oscillation circuit 12 of this embodiment includes a set 21 of variable capacitive elements, whose capacitance can be changed, in the oscillation loop in order to adjust the frequency of the oscillation signal 124. The set 21 of variable capacitive elements may have two or more variable capacitive elements. As described below, a plurality of sets of variable capacitive elements may be provided. A set of variable capacitive elements may include a MOS variable capacitive element. A MOS variable capacitive element is, for example, a varactor, and has capacitance which changes with a potential difference to be applied to terminals.

In FIG. 1, a first wiring 112 of each variable capacitive element (varactor 21A or varactor 21B) of a set of variable capacitive elements is grounded through a fixed capacitor 41A or 41B, and the fixed capacitor 41A and the fixed capacitor 41B may be shared.

In the oscillation circuit 12 of this embodiment, each variable capacitive element (varactor 21A or varactor 21B) of the set 21 of variable capacitive elements includes one MOS variable capacitive element, and has capacitance which changes with a control voltage $V_C$ and a reference voltage $V_{r0}$ or $V_{r1}$. In the varactor 21A, the control voltage $V_C$ is applied to the first wiring 112 through an input resistor 52, and the reference voltage $V_{r0}$ is applied to a second wiring 110 through an input resistor 50. In the varactor 21B, the control voltage $V_C$ is applied to the first wiring 112 through the input resistor 52, and the reference voltage $V_{r1}$ is applied to a second wiring 111 through the input resistor 51.

The first wiring 112 is connected to one terminal (hereinafter, referred to as a first terminal) of a MOS variable capacitive element which is the varactor 21A or 21B. The second wiring 110 is connected to the other terminal (hereinafter, referred to as a second terminal) different from the first terminal of the varactor 21A. The second wiring 111 is connected to the other terminal (hereinafter, referred to as a second terminal) different from the first terminal of the varactor 21B.

The capacitance of the varactor 21A changes with the potential difference between the reference voltage $V_{r0}$ and the control voltage $V_C$. The capacitance of the varactor 21B changes with the potential difference between the reference voltage $V_{r1}$ and the control voltage $V_C$. In the oscillation circuit 12 of this embodiment, since the frequency of the oscillation signal 124 changes according to change in composite capacitance of the set 21 of variable capacitive elements, frequency adjustment can be made.

1.2. Relationship Between Control Voltage and Capacitance

In the oscillation circuit 12 of this embodiment, the control voltage $V_C$ is used in common in the variable capacitive elements (varactor 21A and varactor 21B) constituting the set 21 of variable capacitive elements, and the reference voltages $V_{r0}$ and $V_{r1}$ have different potentials. As described below, the number of variable capacitive elements constituting a set of variable capacitive elements is not limited to two, and may increase, and in this case, the control voltage $V_C$ is used in common, and the reference voltages have different potentials.

That is, different voltages are applied to the second wirings (as described below, corresponding to the second terminals of MOS variable capacitive elements constituting a set of variable capacitive elements) of a plurality of variable capacitive elements. Hereinafter, the relationship between the control voltage, the reference voltages, and capacitance will be described referring to FIGS. 2 to 4.

Figure 2:
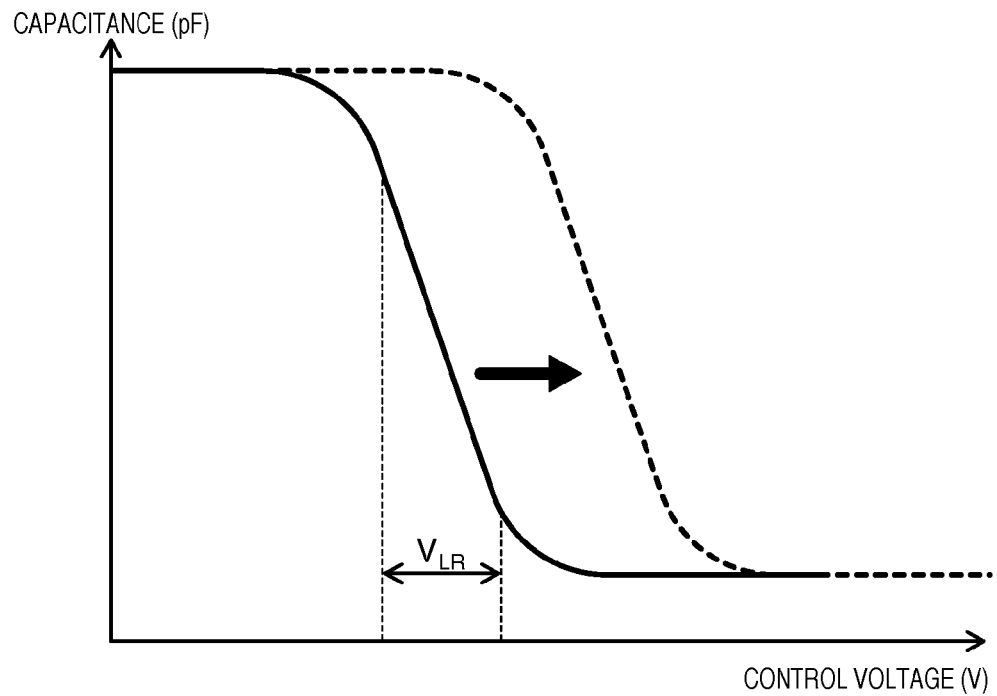
FIG. 2 is a diagram showing change in capacitance with respect to a control voltage of a MOS variable capacitive element.

FIG. 2 is a diagram showing change in capacitance with respect to a control voltage of one MOS variable capacitive element. In the oscillation circuit 12 of this embodiment, the set 21 of variable capacitive elements include MOS variable capacitive elements. Here, a variable capacitive element may be of a PN junction type, however, as in this embodiment, a MOS variable capacitive element is widely used for the purposes of implementation of an integrated circuit and low voltage.

A MOS variable capacitive element has a feature in that capacitance changes steeply in a narrow voltage range, compared to a PN junction type. For this reason, a linear region of a curve (hereinafter, referred to as capacitance characteristic) representing change in capacitance is narrow. In general, in an oscillation circuit which uses a MOS variable capacitive element, if the magnitude of change in voltage is the same, change in capacitance should be the same. This is because, when change in voltage is the same and change in capacitance is different, it is difficult for the oscillation circuit to appropriately adjust the frequency.

Accordingly, if the oscillation circuit has only one MOS variable capacitive element, in frequency adjustment, a voltage range with excellent linearity, that is, only $V_{LR}$ in FIG. 2 is used. At this time, since change in capacitance with respect to change in voltage is small, there is a problem in that the frequency variable width is inevitably small, and it is not possible to realize a necessary frequency variable width as the oscillation circuit.

The capacitance characteristic can be shifted by changing a voltage (on a reference voltage side or a control voltage side, and in this example, on a reference voltage side) to be applied to one terminal of the MOS variable capacitive element. FIG. 2 shows a state where, if a voltage to be applied to the reference voltage side of the MOS variable capacitive element changes like a solid line, the capacitance characteristic of the solid line is shifted to a capacitance characteristic indicated by a dotted line.

Figure 3:
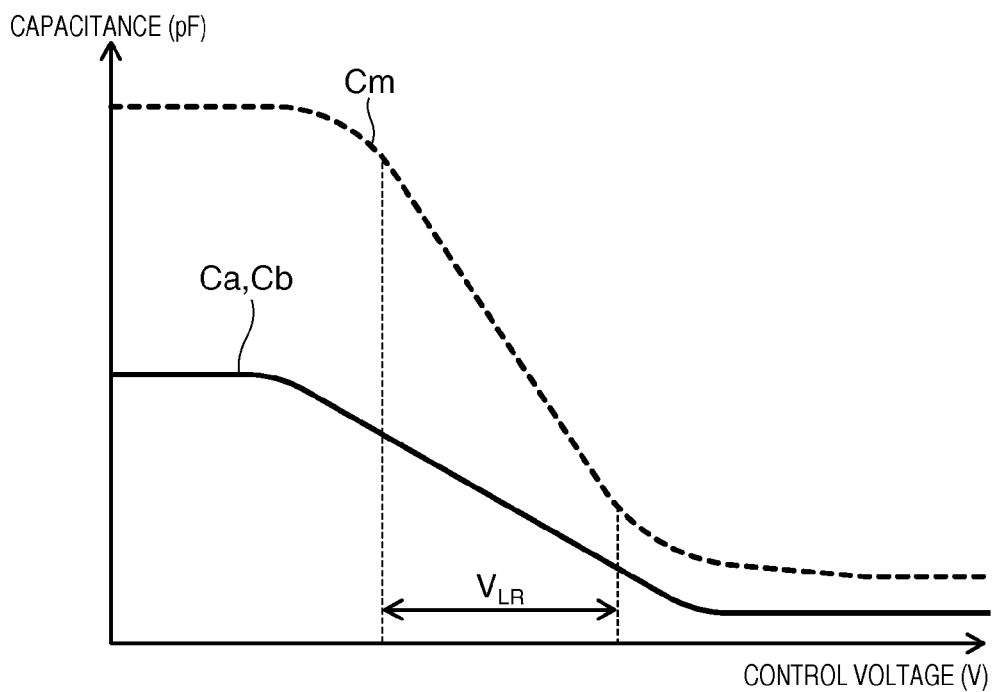
FIG. 3 is a diagram showing change in composite capacitance of a plurality of MOS variable capacitive elements with respect to a control voltage (when a common reference voltage and a common control voltage are applied).

Hereinafter, a case where a voltage range with excellent linearity is expanded in accord with the above property when an oscillation circuit has a plurality of MOS variable capacitive elements will be described. FIG. 3 shows capacitance characteristics Ca and Cb and a curve (hereinafter, referred to as a composite capacitance characteristic Cm) representing change in composite characteristic when an oscillation circuit has two MOS variable capacitive elements.

At this time, even though change shown in FIG. 3 is obtained by applying the same reference voltage to one terminal of the two MOS variable capacitive elements and applying the same control voltage to the other terminal, the composite capacitance characteristic Cm itself increases. Meanwhile, since change in Cm is steep, a voltage range ($V_{LR}$ of FIG. 3) with excellent linearity is the same as when only one MOS variable capacitive element is provided (see $V_{LR}$ of FIG. 2). For this reason, change in capacitance with respect to change in voltage is large, that is, sensitivity of the variable capacitive element is high, making it difficult to perform capacitance adjustment.

However, when different reference voltages are applied to one terminal of two MOS variable capacitive elements, it is possible to expand a voltage range ($V_{LR}$ of FIG. 4) with excellent linearity of the composite capacitance characteristic Cm. At this time, the reference voltages to be applied are adjusted such that the capacitance characteristic Ca is linear in a region lower than a center voltage (when Vdd=1.8 V, for example, 0.9 V) of the control voltage, and the capacitance characteristic Cb is linear in a region higher than the center voltage of the control voltage.

Figure 4:
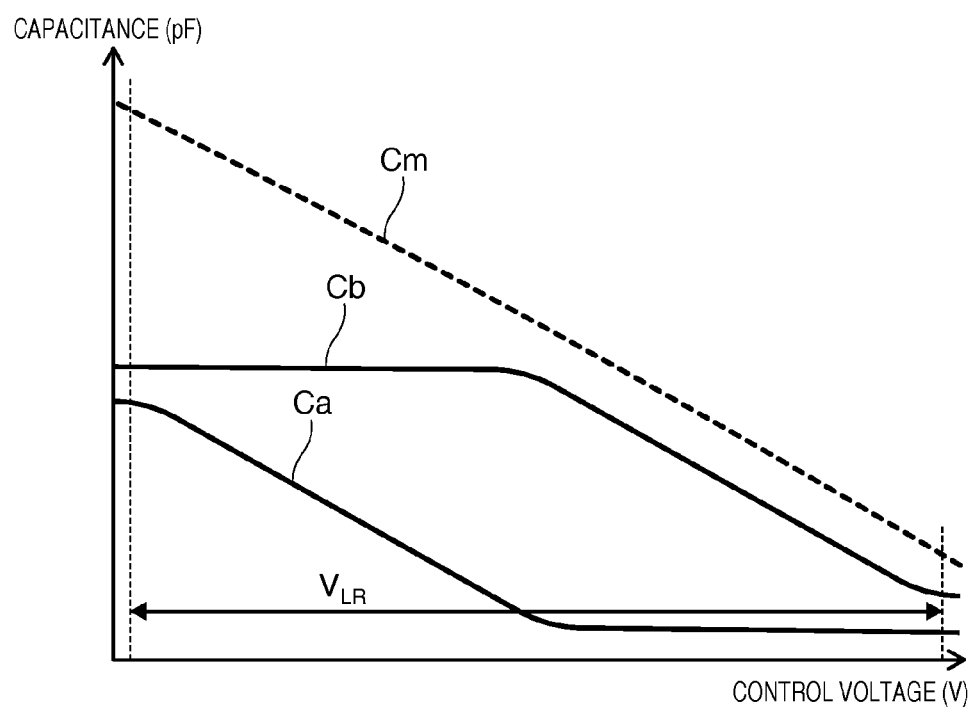
FIG. 4 is a diagram showing change in composite capacitance of a plurality of MOS variable capacitive elements with respect to a control voltage (when different reference voltages and a common control voltage are applied).

An oscillation circuit which includes two MOS variable capacitive elements having the composite capacitance characteristic Cm shown in FIG. 4 can allow the control voltage to vary in a wide range (the range of $V_{LR}$ of FIG. 4) compared to the related art while securing linearity. In the oscillation circuit 12 of this embodiment, by changing the reference voltage to be applied to the second terminal of each MOS variable capacitive element constituting a set of variable capacitive elements, the composite capacitance characteristic of the set of variable capacitive elements has excellent linearity in a wide voltage range, and change in capacitance with respect to change in voltage is small, that is, sensitivity of the variable capacitive element is low, thereby facilitating capacitance adjustment.

1.3. First Comparative Example

Figure 5:
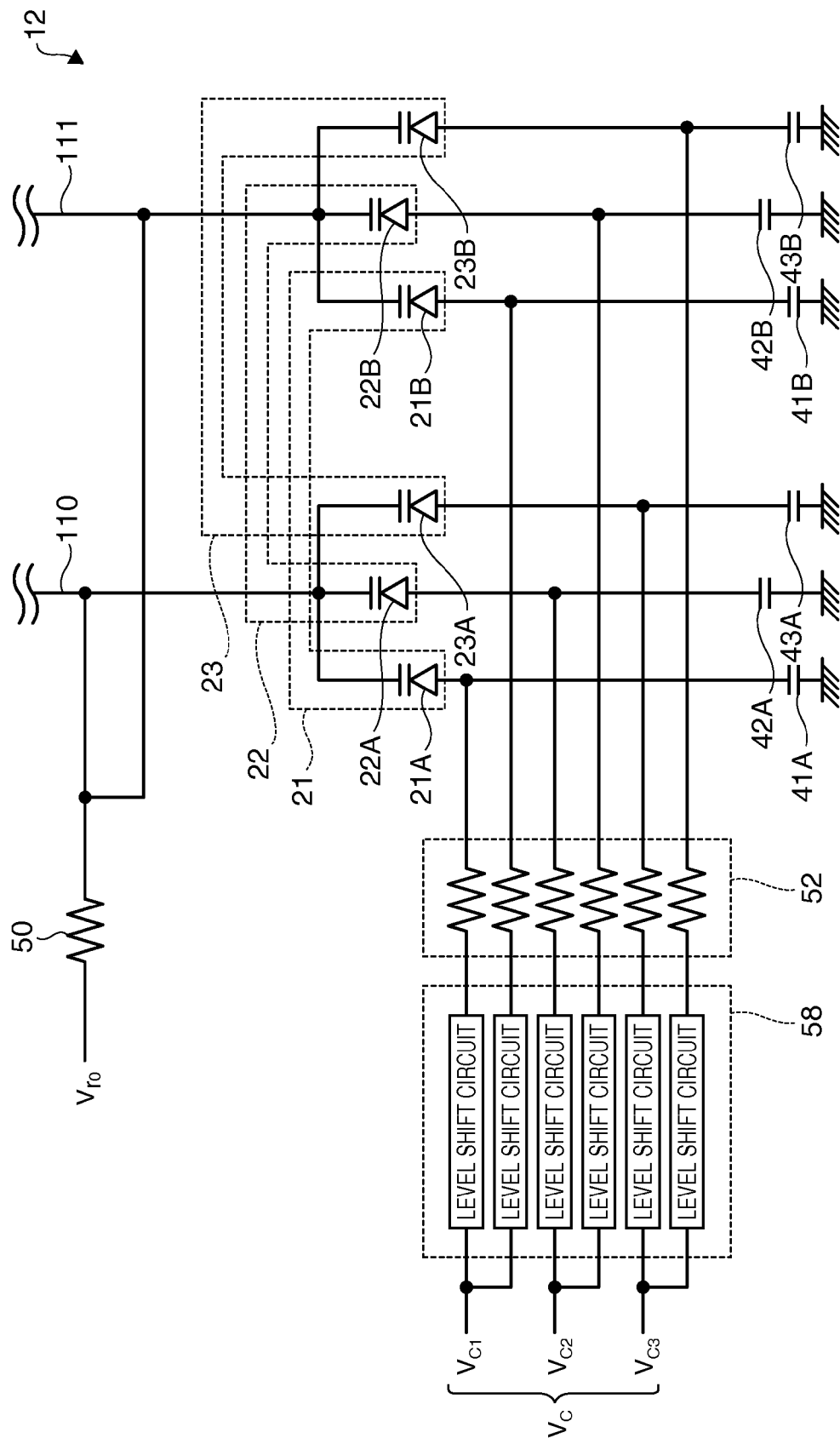
FIG. 5 is a diagram showing a detailed configuration example of an oscillation circuit of a first comparative example.

Prior to describing a detailed configuration example of the oscillation circuit 12 of this embodiment, a first comparative example will be described for comparison. FIG. 5 is a diagram showing a detailed configuration example of an oscillation circuit of the first comparative example. The oscillation circuit of the first comparative example uses a method disclosed in JP-A-2007-19565 in which a level shift circuit 58 is provided on a control voltage $V_C$ side in order to expand a voltage range with excellent linearity for the composite capacitance characteristic Cm. In FIG. 5, in the oscillation circuit of the first comparative example, only a part of a portion corresponding to the oscillation circuit 12 of FIG. 1 is shown. The same elements as those in FIG. 1 are represented by the same reference numerals, and descriptions thereof will not be repeated. In the drawings after FIG. 5, the oscillation signal 124 will be omitted.

As in the oscillation circuit 12 of this embodiment, it is assumed that the oscillation circuit of the first comparative example constitutes a part of the TCXO. As shown in FIG. 5, in the oscillation circuit 12 of the first comparative example, the control voltage $V_C$ has a group of three kinds of voltages. Specifically, the control voltage $V_c$ has a control voltage $V_{C1}$ for external control, a control voltage $V_{C2}$ for temperature compensation, and a control voltage $V_{C3}$ for frequency offset. In this example, although three kinds are used, two kinds or four kinds or more may be used.

The control voltages $V_{C1}$, $V_{C2}$, and $V_{C3}$ are respectively applied to sets 21, 22, and 23 of variable capacitive elements in the oscillation circuit of the first comparative example. The sets 21, 22, and 23 of the variable capacitive elements respectively have a varactor 21A and a varactor 21B, a varactor 22A and a varactor 22B, and a varactor 23A and a varactor 23B. One variable capacitive element of the three sets of variable capacitive elements is the varactors 21A, 22A, and 23A as MOS variable capacitive elements. As shown in FIG. 5, the control voltages $V_{C1}$, $V_{C2}$, and $V_{C3}$ are respectively applied to one terminal (corresponding to the first terminal) of the varactors 21A, 22A, and 23A through a level shift circuit 58 and an input resistor 52.

The first terminals of the varactors 21A, 22A, and 23A are respectively grounded through fixed capacitors 41A, 42A, and 43A. The fixed capacitors 41A, 42A, and 43A correspond to the fixed capacitor 41A of FIG. 1.

In the oscillation circuit of the first comparative example, the other variable capacitive element of the set of variable capacitive elements has the same configuration as one variable capacitive element. The varactors 21B, 22B, and 23B of the other variable capacitive element correspond to the varactors 21A, 22A, and 23A of one variable capacitive element. The fixed capacitors 41B, 42B, and 43B of the other variable capacitive element correspond to the fixed capacitor 41B of FIG. 1.

In the oscillation circuit of the first comparative example, the other terminal (corresponding to the second terminal) of the varactors 21A, 22A, and 23A is connected to the second wiring 110 of the set 21 of variable capacitive elements. The other terminal (corresponding to the second terminal) of the varactors 21B, 22B, and 23B is connected to the second wiring 111. A reference voltage $V_{r0}$ is applied to the second wiring 110 and the second wiring 111 through the input resistor 50.

Conversely to the description referring to FIGS. 2 to 4, for example, a voltage range with excellent linearity of the composite capacitance characteristic Cm (see FIG. 4) is expanded by applying different control voltages to the first terminals of the varactor 21A and the varactor 21B. Different control voltages are also applied to the first terminals of the varactor 22A and the varactor 22B. The same applies to the varactor 23A and the varactor 23B.

For example, a level shift circuit 58 between the control voltage $V_{C1}$ and the varactor 21A and a level shift circuit 58 between the control voltage $V_{C1}$ and the varactor 21B give a level difference in control voltage, and adjustment is thus made such that different voltages are applied to the first terminals of the varactor 21A and the varactor 21B. For the varactor 22A and the varactor 22B, and the varactor 23A and the varactor 23B, the same adjustment is performed by the respective level shift circuits 58.

With this method, in the oscillation circuit of the first comparative example, it is possible to expand a voltage range with excellent linearity. However, the oscillation circuit of the first comparative example requires the level shift circuit 58. In particular, in the TCXO, since a plurality of kinds of control voltages are used in order to increase compensation precision, the number of level shift circuits 58 increases in proportion to the number of kinds of control voltages (in this example, six level shift circuits 58 are required). For this reason, circuit scale and power consumption may increase.

1.4. Modification

Figure 6:
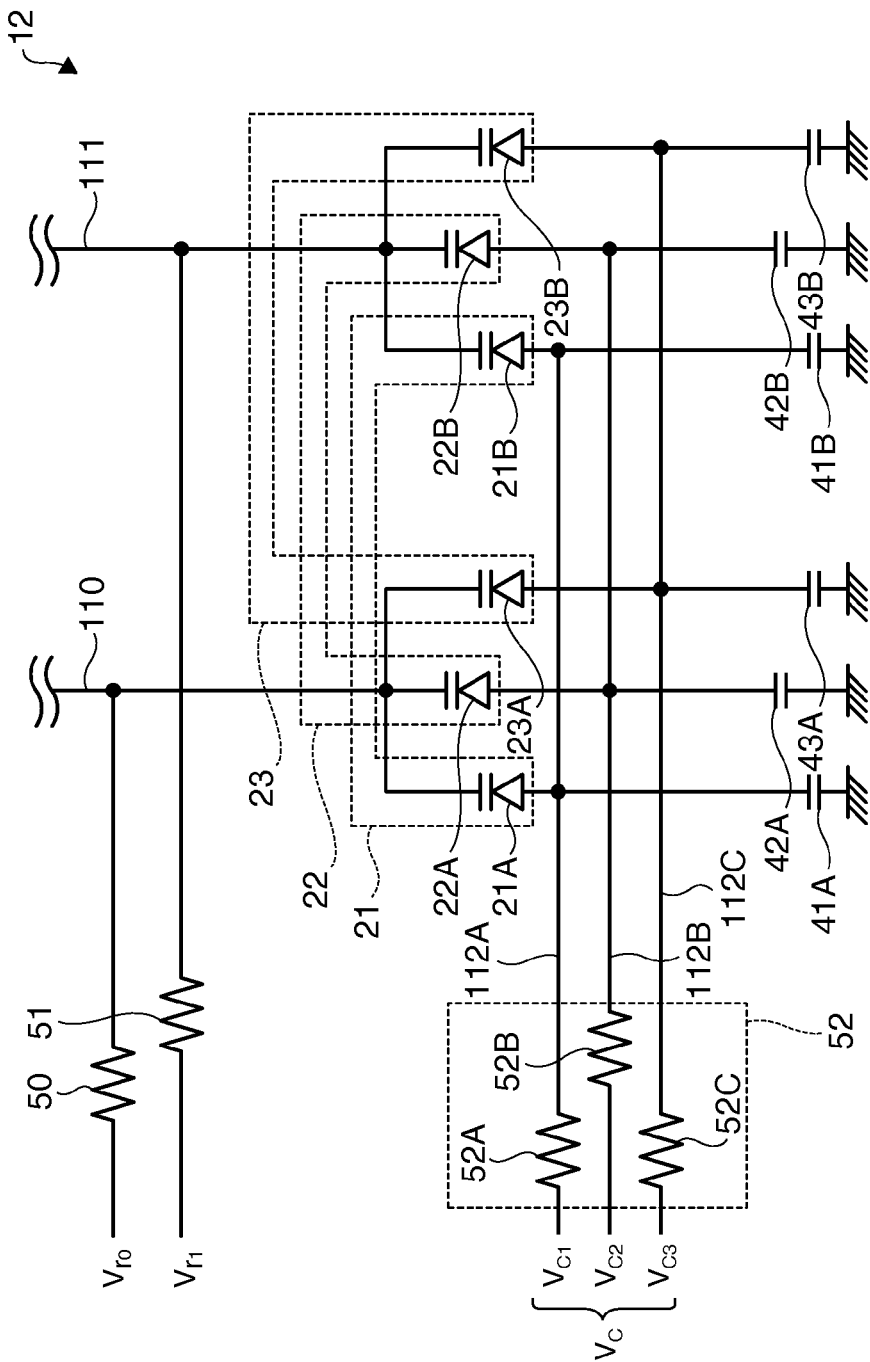
FIG. 6 is a diagram showing a detailed configuration example of a modification of the oscillation circuit of the first embodiment.

FIG. 6 is a diagram showing a detailed configuration example of an oscillation circuit 12 as a modification of the first embodiment. In this modification, a configuration example in which there are a plurality of sets of variable capacitive elements (as an example, as in the first comparative example, three sets) is described. Unlike the oscillation circuit of the first comparative example, the oscillation circuit 12 of this modification includes no level shift circuit. As in FIG. 5, in FIG. 6, only a part of the oscillation circuit 12 of FIG. 1 is shown. The same elements as those in FIGS. 1 to 5 are represented by the same reference numerals, and descriptions thereof will not be repeated.

In the oscillation circuit 12 of this modification, as described referred to FIGS. 2 to 4, different reference voltages are applied to the second terminals of two MOS variable capacitive elements, thereby expanding a voltage range with excellent linearity of the composite capacitance characteristic Cm (see FIG. 4). At this time, a common control voltage is applied to the first terminals of the two MOS variable capacitive elements.

As in FIG. 6, in the oscillation circuit 12 of this modification, the sets 21, 22, and 23 of variable capacitive elements respectively include varactors 21A and 21B, varactors 22A and 22B, and varactors 23A and 23B. One terminal (corresponding to the first terminal) of the varactors 21A, 22A, and 23A is connected to first wirings 112A, 112B, and 112C. Control voltages $V_{C1}$, $V_{C2}$, and $V_{C3}$ are respectively applied to the first wirings 112A, 112B, and 112C through input resistors 52A, 52B, and 52C.

In the oscillation circuit 12 of this modification, the varactors 21B, 22B, 23B respectively constitute sets of variable capacitive elements along with the varactor 21A, 22A, and 23A. The same control voltage $V_{C1}$ is applied to the first terminals of the varactor 21A and the varactor 21B. Similarly, the same control voltage $V_{C2}$ is applied to the first terminals of the varactor 22A and the varactor 22B, and the same control voltage $V_{C3}$ is applied to the first terminals of the varactor 23A and the varactor 23B.

In the oscillation circuit 12 of this modification, the other terminal (corresponding to the second terminal) of the varactors 21A, 22A, and 23A is connected to a second wiring 110. The other terminal (corresponding to the second terminal) of the varactors 21B, 22B, and 23B is connected to the second wiring 111. A reference voltage $V_{r0}$ is applied to the second wiring 110 through an input resistor 50, and a reference voltage $V_{r1}$ is applied to the second wiring 111 through an input resistor 51.

In FIG. 6, since the reference voltages $V_{r0}$ and $V_{r1}$ are different voltages, different voltages are applied to the varactors 21A, 22A, and 23A and the varactors 21B, 22B, and 23B, thereby expanding a voltage range with excellent linearity of the composite capacitance characteristic Cm (see FIG. 4).

For example, the reference voltage $V_{r0}$ and the reference voltage $V_{r1}$ providing with a voltage difference therebetween are applied such that the capacitance characteristic of the varactor 21A is linear in a region lower than a center voltage (when Vdd=1.8 V, for example, 0.9 V) of the control voltage, and the capacitance characteristic of the varactor 21B is linear in a region higher than the center voltage of the control voltage. The same applies to the varactor 22A and the varactor 22B, and the varactor 23A and the varactor 23B.

At this time, the oscillation circuit 12 of this modification can expand a voltage range with excellent linearity. Since the level shift circuit 58 which is provided in the oscillation circuit of the first comparative example is not provided, there is no case where circuit scale and power consumption increase. That is, in the oscillation circuit 12 of this modification, it is possible to expand the variable width of capacitance while securing linearity of change in capacitance of the variable capacitive elements, and to suppress an increase in circuit scale and power consumption.

In the oscillation circuit 12 of this modification, the variable capacitive elements (in the example of FIG. 6, the varactor 21A and the varactor 21B, the varactor 22A and the varactor 22B, and the varactor 23A and the varactor 23B) to which the common control voltage is applied may have different capacitance characteristics. In the example of FIG. 6, if the reference voltage $V_{r0}$ and the reference voltage $V_{r1}$ have an appropriate difference in voltage to expand a voltage range with excellent linearity of the composite capacitance characteristic Cm (see FIG. 4), for example, the capacitance characteristic of the varactor 21A may be different from the capacitance characteristic of the varactor 21B.

That is, in the oscillation circuit 12 of this modification, variable capacitive elements having different capacitance characteristics are combined, making it possible to expand a voltage range with excellent linearity of the composite capacitance characteristic and to increase a degree of freedom for design.

1.5. Other Modifications

The oscillation circuit 12 of the first embodiment may be modified as described below, in addition to the configurations of FIGS. 1 and 6. In the oscillation circuit 12 of other modifications, it is possible to expand the variable width of capacitance while securing linearity of the variable capacitive elements, and since no level shift circuit 58 is provided, it is possible to suppress an increase in circuit scale and power consumption. In FIGS. 7 to 10, the same elements as those in FIG. 1 are represented by the same reference numerals, and descriptions thereof will not be repeated.

The constituent elements of the oscillation circuit of FIG. 1 or 6 can be appropriately commonalized or individualized. For example, the input resistor 52 of FIG. 1 may be individually provided in the input portion of each of the varactors 21A and 21B. At this time, adjustment or the like according to an input load of each of the varactors 21A and 21B can be performed.

Figure 7:
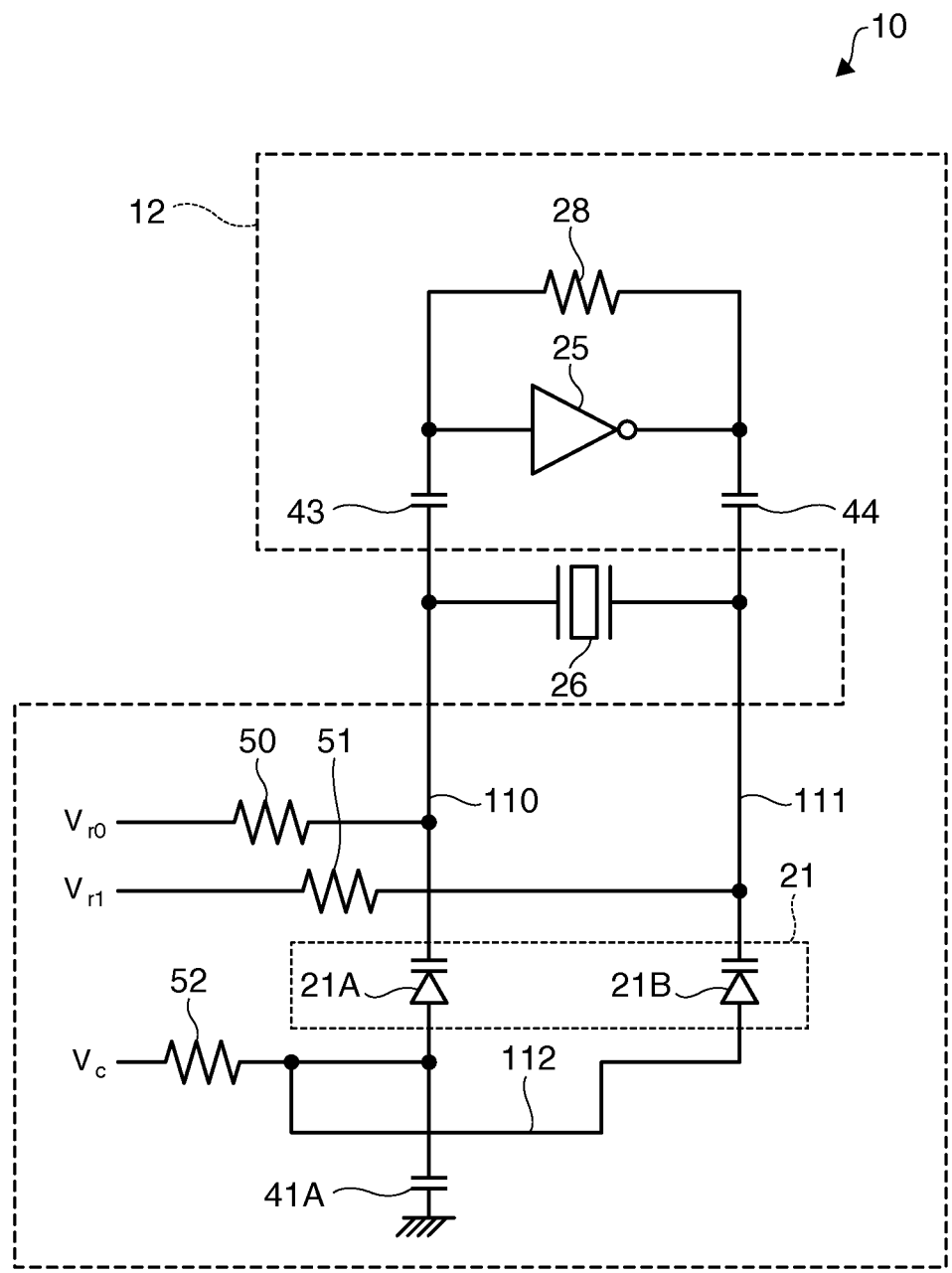
FIG. 7 is a diagram showing another modification of the oscillation circuit of the first embodiment.

As in an oscillation circuit 12 shown in FIG. 7, the fixed capacitor 41A and the fixed capacitor 41B may be commonalized, and only one fixed capacitor 41A may be provided. At this time, since the fixed capacitor 41B is not required, it is possible to reduce the circuit scale.

Figure 8:
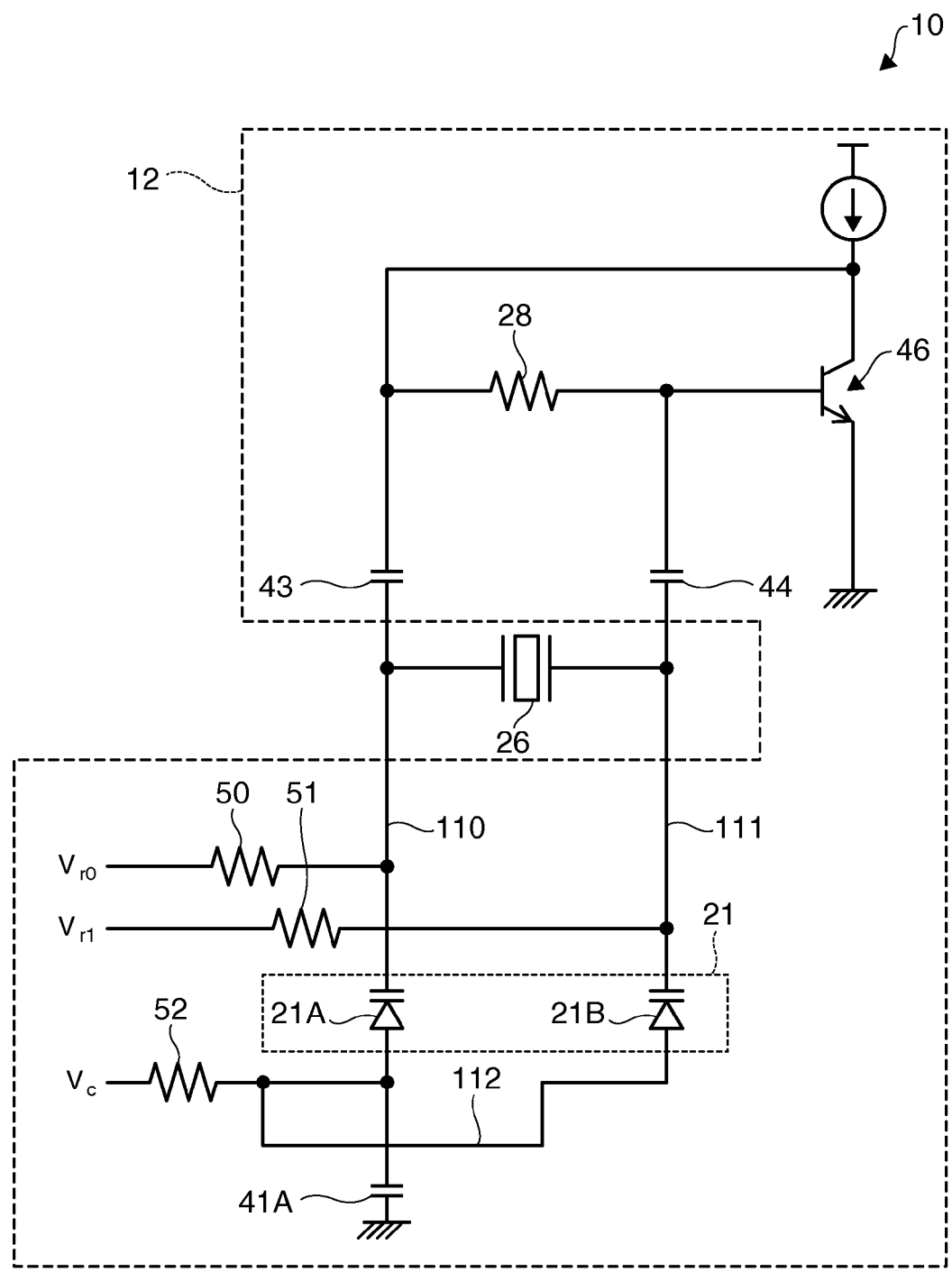
FIG. 8 is a diagram showing yet another modification of the oscillation circuit of the first embodiment.

As in an oscillation circuit 12 shown in FIG. 8, a transistor 46 connected to a constant current source may be used as an amplification element, instead of the inverter 25.

Figure 9:
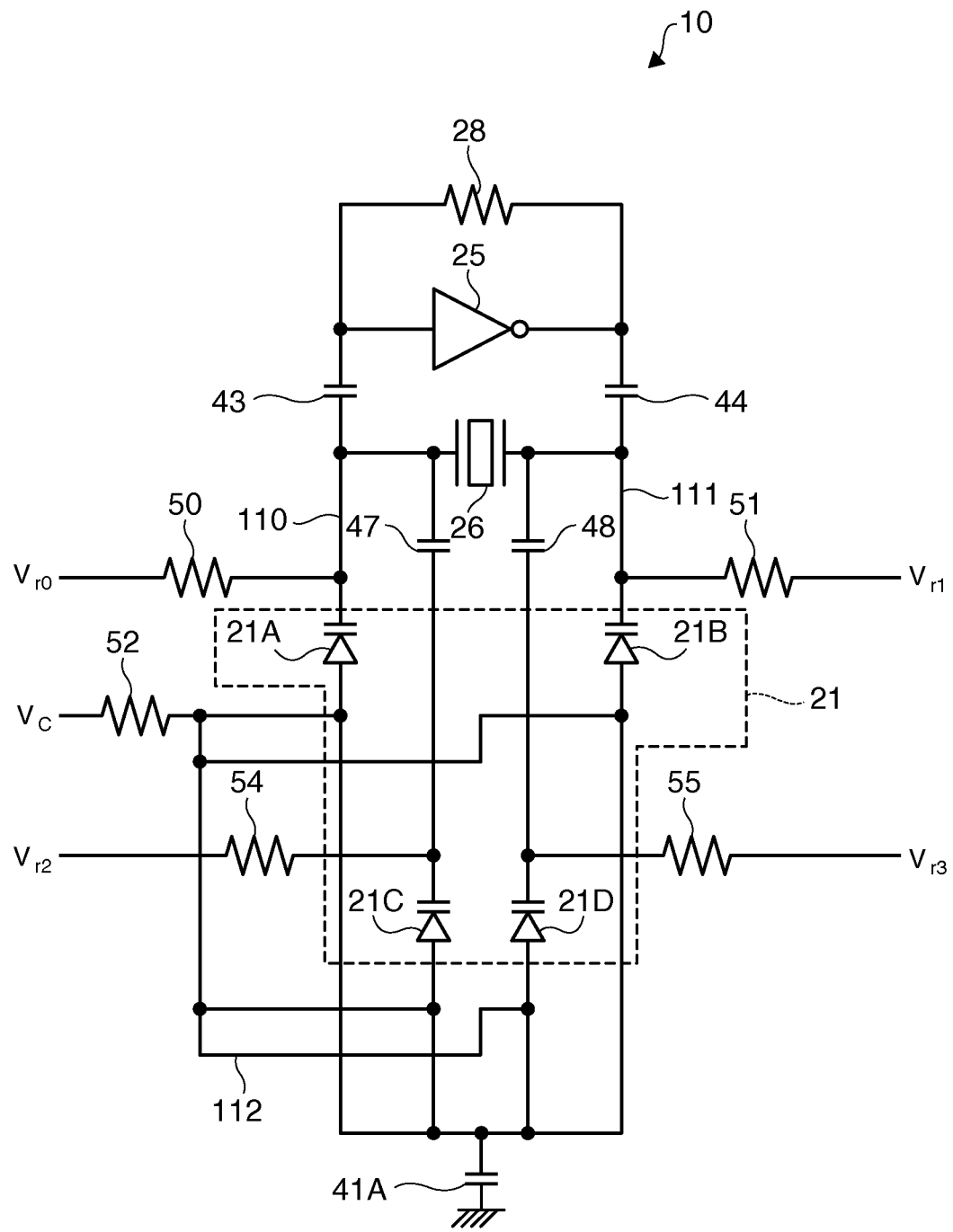
FIG. 9 is a diagram showing a modification in which the number of variable capacitive elements of a set of variable capacitive elements of the oscillation circuit of the first embodiment increases.

As in an oscillation circuit 12 shown in FIG. 9, multiple variable capacitive elements constituting a set of variable capacitive elements may be arranged compared to the oscillation circuit 12 of the first embodiment. In the example of FIG. 9, varactors 21C and 21D are respectively connected to the output side and the input side of the crystal resonator 26 through DC cut capacitors 47 and 48, and four variable capacitive elements constitute a set of variable capacitive elements. Only one of the varactors 21C and 21D may be connected.

In the oscillation circuit 12 of FIG. 9, adjustment by the varactors 21C and 21D is also possible, making it easy to obtain a necessary frequency variable width. Reference voltages $V_{r2}$ and $V_{r3}$ correspond to the reference voltages $V_{r0}$ and $V_{r1}$, and input resistors 54 and 55 correspond to the input resistors 50 and 51, and thus descriptions thereof will not be repeated.

Figure 10:
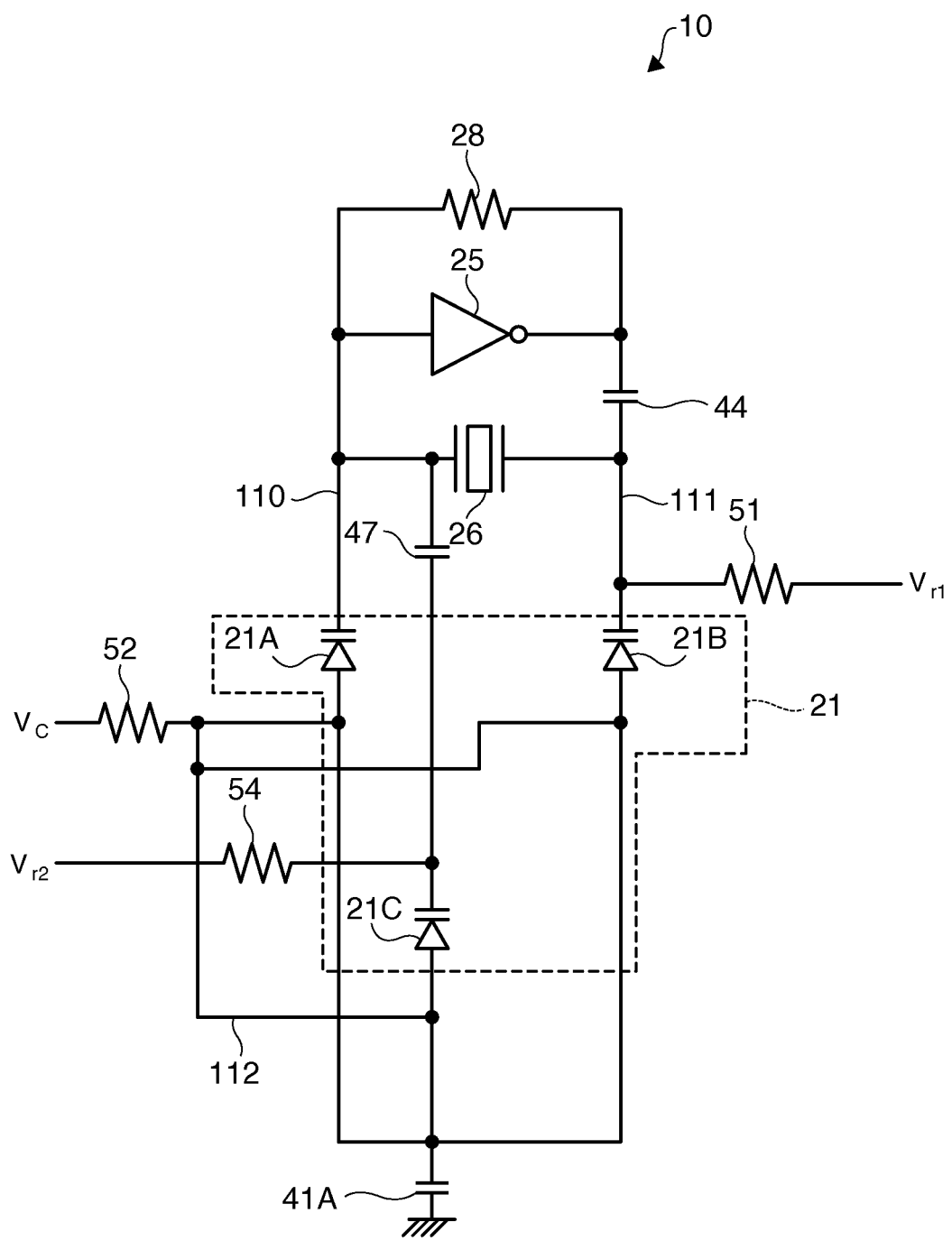
FIG. 10 is a diagram showing another modification in which the number of variable capacitive elements of a set of variable capacitive elements of the oscillation circuit of the first embodiment.

FIG. 10 shows an example where the varactor 21D in the oscillation circuit 12 of FIG. 9 is omitted, the reference voltage $V_{r0}$, the input resistor 50, and the DC cut capacitor are removed, and three variable capacitive elements constitute a set of variable capacitive elements. At this time, of the two varactors 21A and 21C on the input side of the crystal resonator 26, the varactor 21A uses a self-bias potential of the inverter 25 as a reference voltage.

These modifications of the first embodiment may become modifications of an oscillation circuit 12 of a second embodiment described below.

2. Second Embodiment 2.1. Outline of Oscillation Circuit

Figure 11:
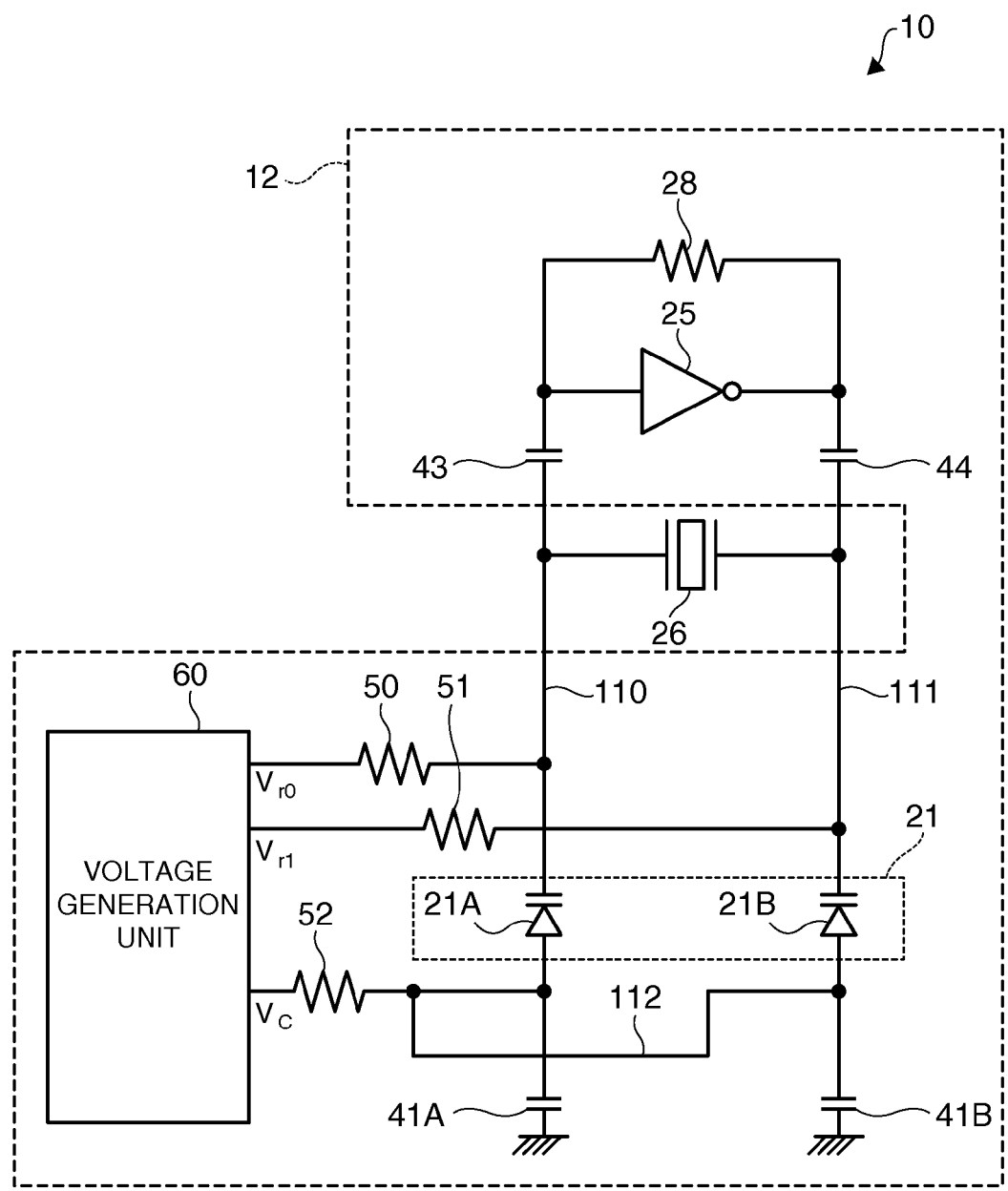
FIG. 11 is a diagram showing a configuration example of an oscillation circuit of a second embodiment.

FIG. 11 is a diagram showing a configuration example of an oscillation circuit 12 of a second embodiment. Unlike the first embodiment, the oscillation circuit 12 of this embodiment includes a voltage generation unit 60 which generates reference voltages $V_{r0}$ and $V_{r1}$ and a control voltage $V_C$. The same elements as those in FIGS. 1 to 10 are represented by the same reference numerals, and description thereof will not be repeated.

In the oscillation circuit 12 of this embodiment, the voltage generation unit 60 can easily adjust the reference voltages $V_{r0}$ and $V_{r1}$. For this reason, fine adjustment is possible such that variable sensitivity of the varactors 21A and 21B is flat (a state where change in frequency of an oscillation signal is unbiased with respect to a control voltage), that is, more excellent linearity is exhibited.

2.2. Second Comparative Example

Figure 12:
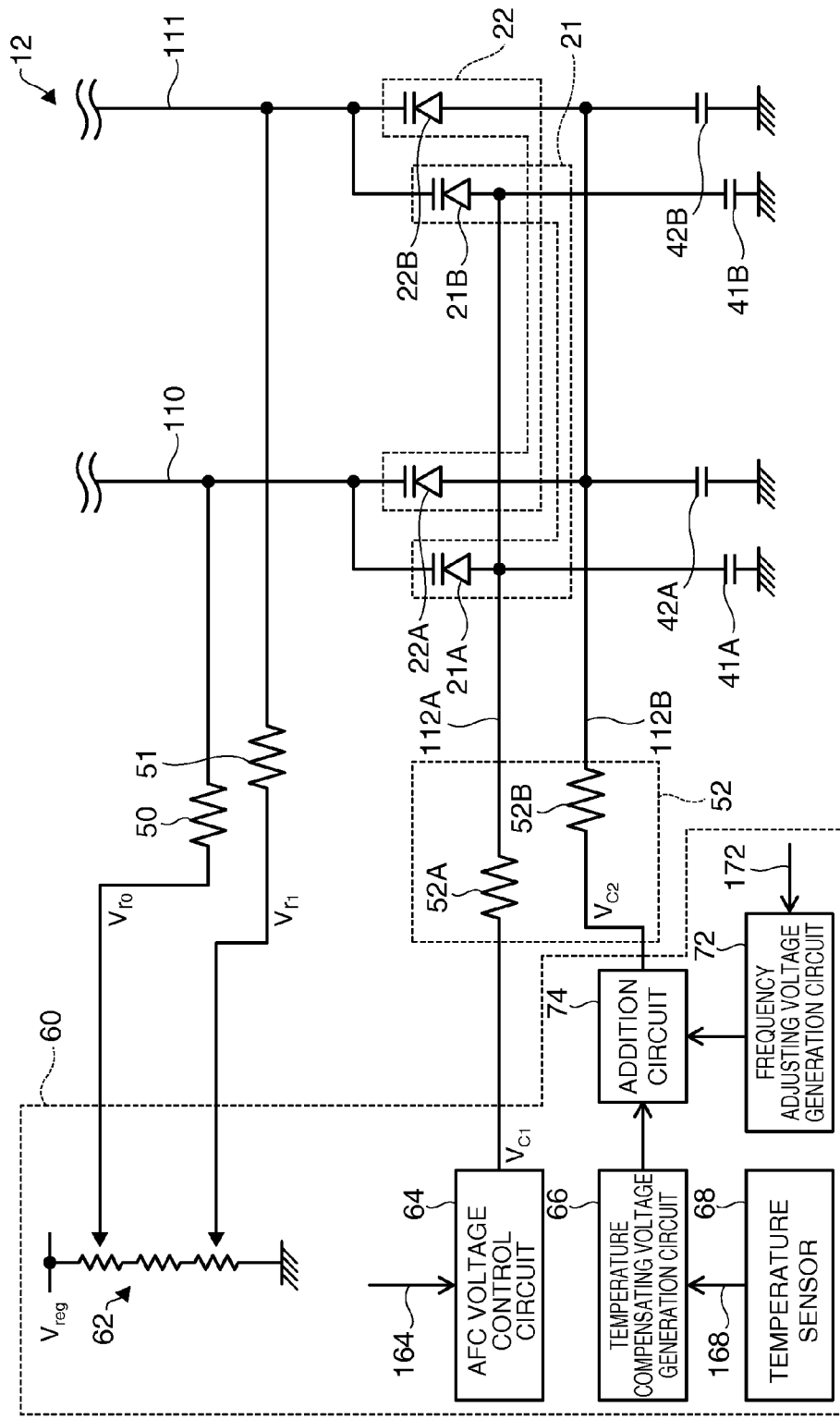
FIG. 12 is a diagram showing a detailed configuration example of an oscillation circuit of a second comparative example.

Prior to describing a detailed configuration example of the oscillation circuit 12 of this embodiment, a second comparative example will be described for comparison. As in the oscillation circuit 12 of this embodiment, it is assumed that an oscillation circuit of the second comparative example constitutes a part of the TCXO. FIG. 12 is a diagram showing a detailed configuration example of the oscillation circuit of the second comparative example. In FIG. 12, in the oscillation circuit of the second comparative example, only a part of a portion corresponding to the oscillation circuit 12 of FIG. 11 is shown. The same elements as those in FIGS. 1 to 11 are represented by the same reference numerals, and descriptions thereof will not be repeated.

The voltage generation unit 60 of the second comparative example includes a resistance division circuit 62 which generates the reference voltages $V_{r0}$ and $V_{r1}$. The voltage generation unit 60 of the second comparative example includes an AFC voltage control circuit 64 which generates a control voltage $V_{C1}$ on the basis of a control signal 164. The voltage generation unit 60 of the second comparative example includes a temperature compensating voltage generation circuit 66 which generates a control voltage for temperature compensation on the basis of temperature data 168 from a temperature sensor 68. The voltage generation unit 60 of the second comparative example includes a frequency adjusting voltage generation circuit 72 which generates a control voltage for frequency offset on the basis of a control signal 172. The AFC voltage control circuit 64, the temperature compensating voltage generation circuit 66, and the frequency adjusting voltage generation circuit 72 may adjust a control voltage which is generated by the resistance division circuit.

A frequency variation width which should be adjusted by the control voltage for frequency offset generated by the frequency adjusting voltage generation circuit 72 is small. Meanwhile, a frequency variation width which should be adjusted by the control voltage for temperature compensation generated by the temperature compensating voltage generation circuit 66 is large. When varactors to which the control voltage for frequency offset and the control voltage for temperature compensation are applied are individually provided, a varactor having low sensitivity (for example, about 15 ppm/V) of change in capacitance with respect to voltage is required as the former case, and a varactor having high sensitivity (for example, about 50 ppm/V) is required as the latter case.

In the oscillation circuit of the second comparative example, the control voltage is collectively applied to the varactors 22A and 22B having high sensitivity. For this reason, the voltage generation unit 60 of the second comparative example has an addition circuit 74 which combines the control voltage for frequency offset and the control voltage for temperature compensation, and generates one control voltage.

Figure 13:
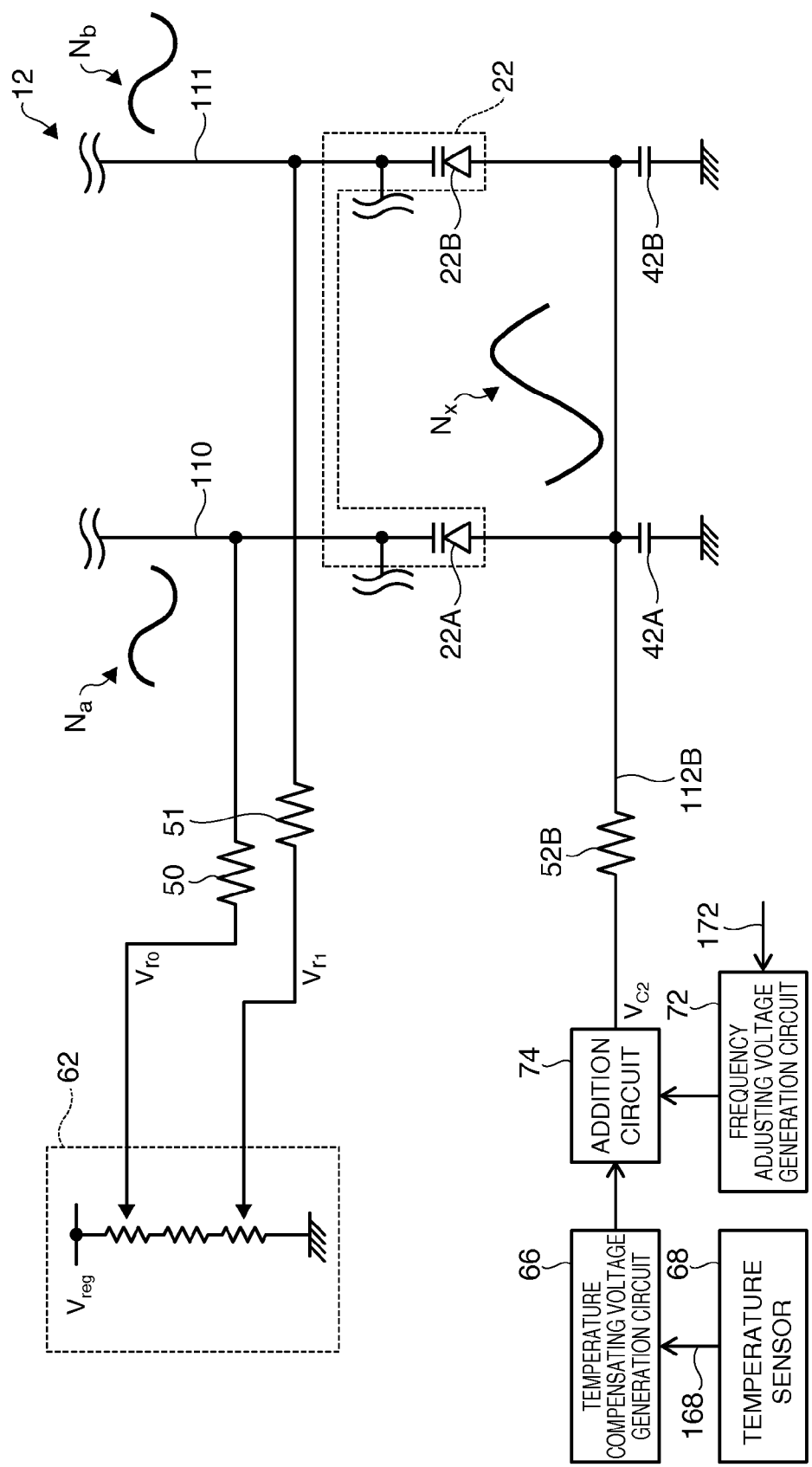
FIG. 13 is a diagram illustrating noise of the oscillation circuit of the second comparative example.

However, in the oscillation circuit of the second comparative example, noise having large variation in voltage is input to the varactors 22A and 22B having high sensitivity. If noise is input, variation in capacitance occurs in the varactors 22A and 22B, causing deterioration of the phase noise characteristic of the oscillation circuit. Thus, it is desirable that there is no noise. FIG. 13 is a diagram illustrating noise of the oscillation circuit of the second comparative example. The same elements as those in FIG. 12 are represented by the same reference numerals, and descriptions thereof will not be repeated.

In FIG. 13, noise $N_x$, $N_a$, and $N_b$ respectively represent noise on one terminal (corresponding to the first terminal) of each of the varactors 21B and 22B, noise on the other terminal (corresponding to the second terminal) of the varactor 22A, and noise on the other terminal (corresponding to the second terminal) of the varactor 22B.

Noise $N_a$ and $N_b$ are noise having the same phase and amplitude transmitted from the resistance division circuit 62. Noise Nx is noise transmitted from a circuit (for example, the addition circuit 74) separated from the resistance division circuit 62, and has phase and amplitude different from noise $N_a$ and $N_b$. For this reason, there is a problem in that noise having different phase and amplitude is put on both terminals of each of the varactors 22A and 22B having high sensitivity, causing an increase in phase nose of the oscillation signal.

2.3. Modification

Figure 14:
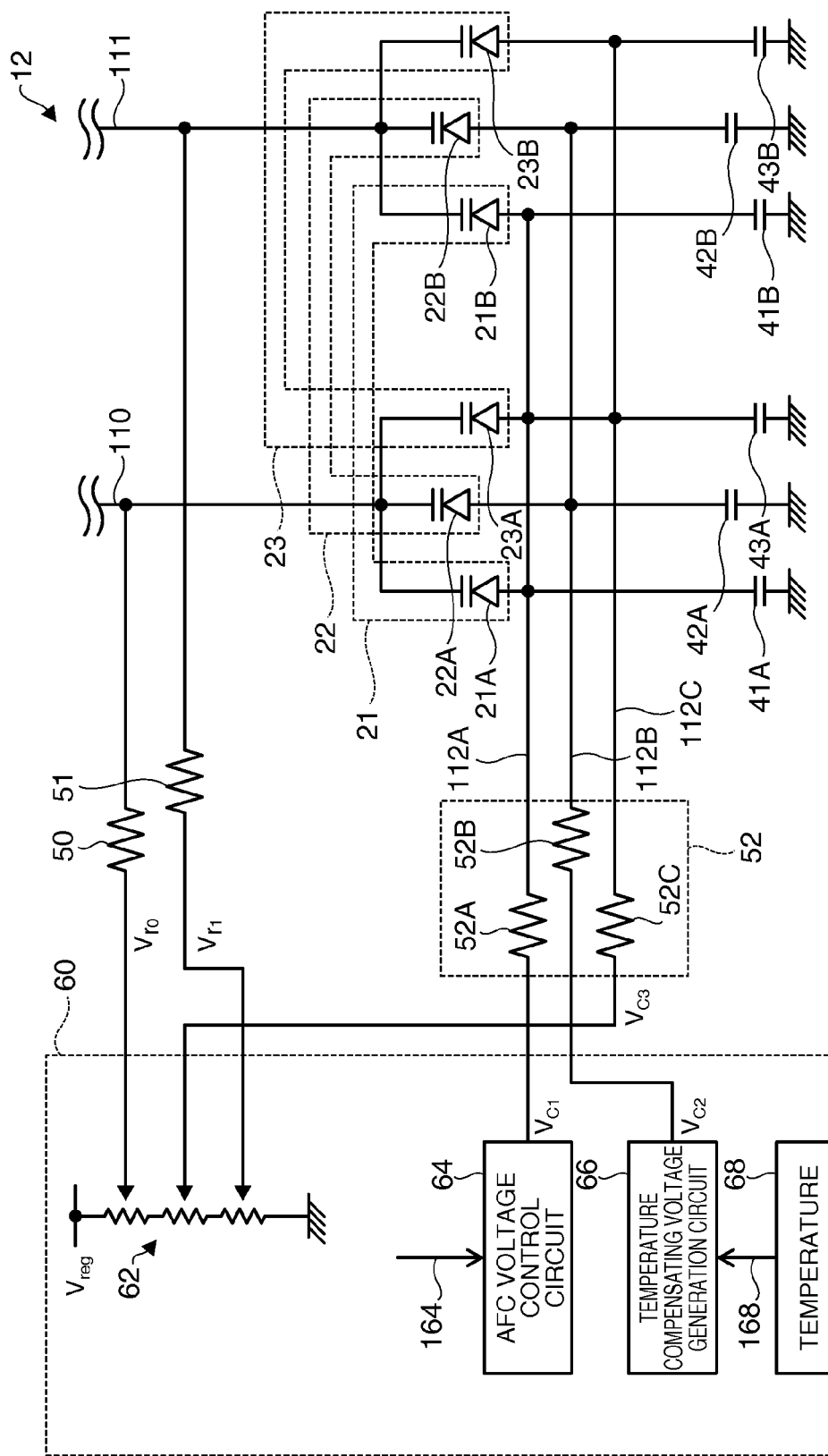
FIG. 14 is a diagram showing a detailed configuration example of a modification of the oscillation circuit of the second embodiment.

FIG. 14 is a diagram showing a detailed configuration example of an oscillation circuit 12 of a modification of the second embodiment. Unlike the oscillation circuit of the second comparative example, an oscillation circuit 12 of this modification includes dedicates varactors 23A and 23B which apply a control voltage for frequency offset generated by the resistance division circuit 62. As in FIGS. 12 to 13, in FIG. 14, only a part of the oscillation circuit 12 of FIG. 11 is shown. The same elements as those in FIGS. 1 to 13 are represented by the same reference numerals, and descriptions thereof will not be repeated.

As in FIG. 14, in the oscillation circuit 12 of this modification, of a group of varactors 21A to 23A, the varactor 23A to which the control voltage for frequency offset is applied is set to a minimum sensitivity variable capacitive element. A minimum sensitivity variable capacitive element is a varactor which has capacitance sensitivity lower than other varactors 21A and 22A. For a group of varactors 21B to 23B, the varactor 23B is a minimum sensitivity variable capacitive element.

For this reason, the control voltage for frequency offset can be handled separately. At this time, unlike the oscillation circuit of the second comparative example, the addition circuit 74 is not required, thereby reducing circuit scale or power consumption compared to the second comparative example.

The oscillation circuit 12 of this modification can solve a problem that large noise occurs in a varactor having high sensitivity of the second comparative example. As in FIG. 14, a control voltage $V_{C3}$ for frequency offset is generated by the resistance division circuit 62. As the control voltage $V_{C3}$ for frequency offset, an intermediate voltage between the reference voltages $V_{r0}$ and $V_{r1}$ is used, and thus, unlike the second comparative example, it is not necessary to provide the frequency adjusting voltage generation circuit 72. As the intermediate voltage, for example, $(V_{r0}+V_{r1})/2$ may be used, or $V_{reg}/2$, or the like may be used.

Figure 15:
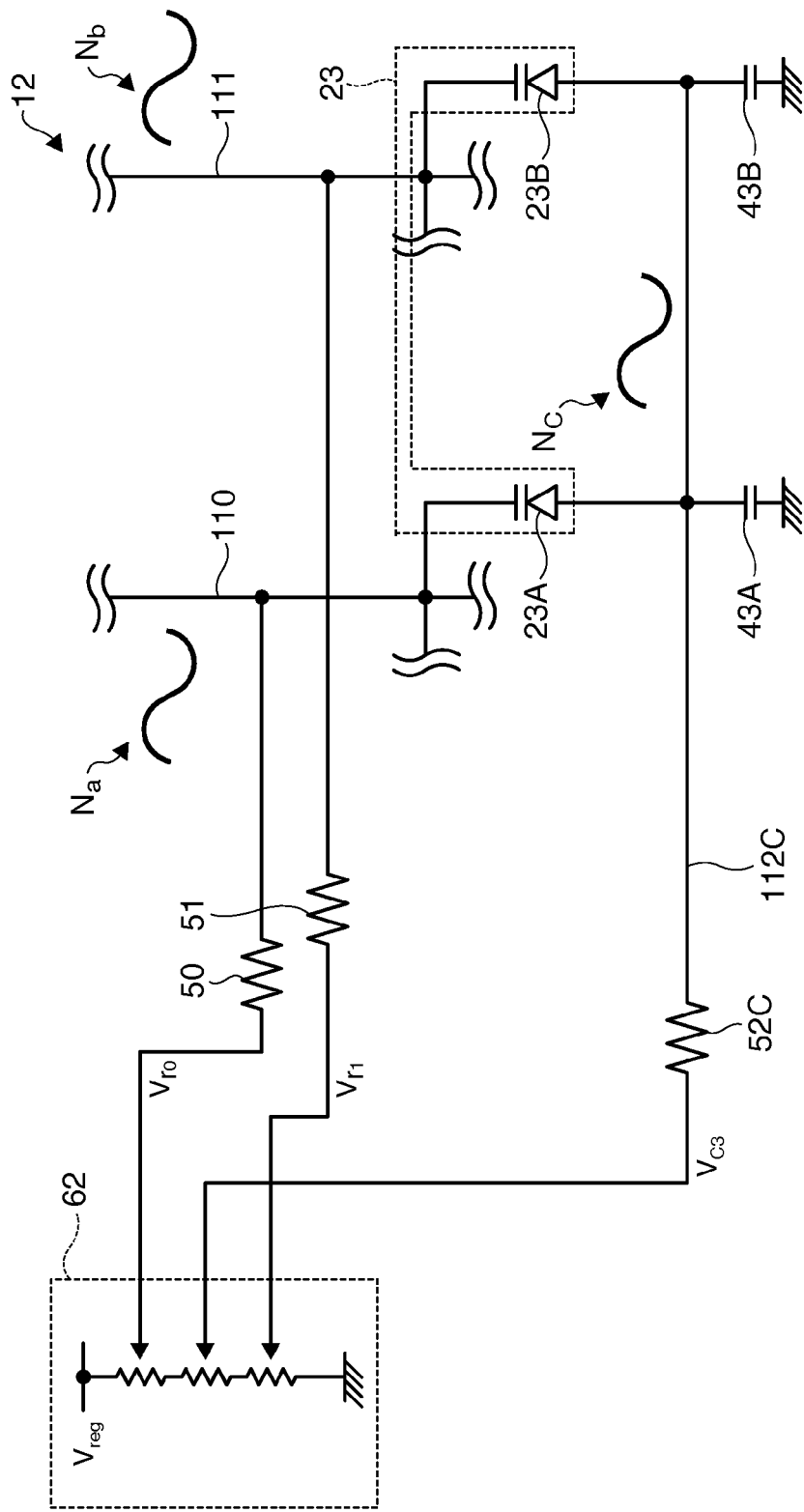
FIG. 15 is a diagram illustrating noise of a modification of the oscillation circuit of the second embodiment.

FIG. 15 is a diagram illustrating noise of the oscillation circuit 12 of this modification. The same elements as those in FIG. 14 are represented by the same reference numerals, and descriptions thereof will not be repeated.

In FIG. 15, noise $N_a$, $N_b$, and $N_c$ respectively represent noise on the other terminal (corresponding to the second terminal) of the varactor 23A, noise on the other terminal (corresponding to the second terminal) of the varactor 23B, and noise on one terminal (corresponding to the first terminal) of each of the varactors 23A and 23B.

Here, noise $N_a$ and $N_b$ are noise having the same phase and amplitude transmitted from the resistance division circuit 62. For this reason, since noise $N_a$, $N_b$, and $N_c$ are put on both terminals of each of the varactors 23A and 23B and cancelled, and capacitance sensitivity of the varactors 23A and 23B is low, it is possible to solve a problem that large noise occurs in the second comparative example.

As described above, in the oscillation circuit 12 of this modification, it is possible to expand the variable width of capacitance while securing linearity of the variable capacitive elements, and since the circuits, such as the frequency adjusting voltage generation circuit 72 and the addition circuit 74, in the second comparative example are not required, it is possible to suppress an increase in circuit scale and power consumption.

3. Application Example 3.1. Electronic Apparatus

An electronic apparatus 300 which is an application example to the first embodiment, the second embodiment, and the modifications thereof will be described referring to FIGS. 16 and 17. The same elements as those in FIGS. 1 to 15 are represented by the same reference numerals, and descriptions thereof will not be repeated.

Figure 16:
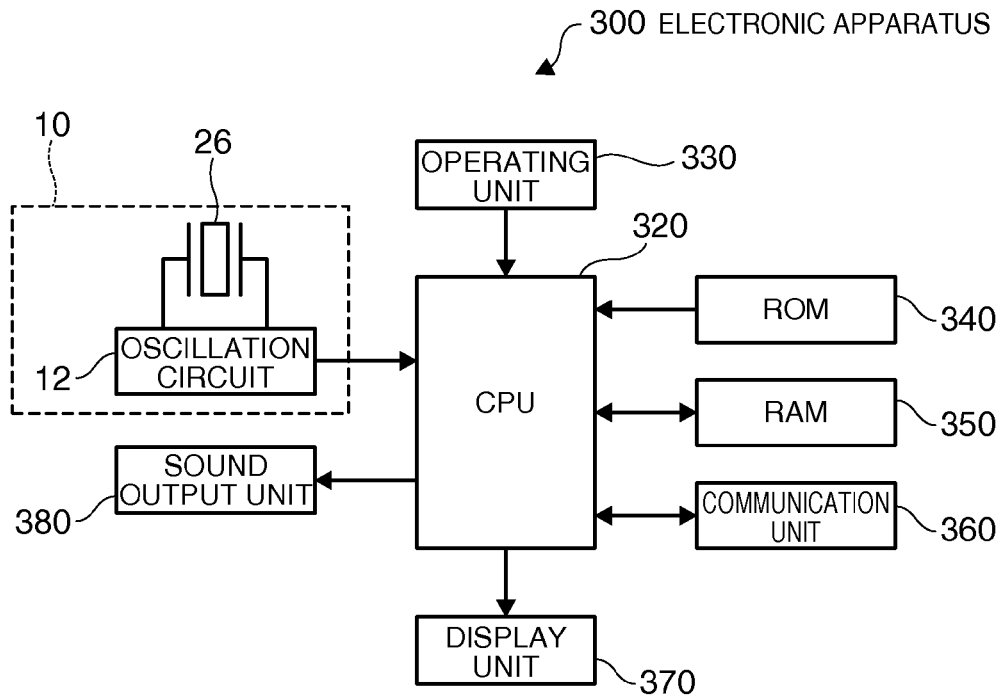
FIG. 16 is a functional block diagram of an electronic apparatus of an application example.

FIG. 16 is a functional block diagram of the electronic apparatus 300 of the application example. The electronic apparatus 300 of the application example includes an oscillation circuit 12 connected to a crystal resonator 26, a central processing unit (CPU) 320, an operating unit 330, a read only memory (ROM) 340, a random access memory (RAM) 350, a communication unit 360, a display unit 370, and a sound output unit 380. In the electronic apparatus 300 of this application example, some of the constituent elements (respective units) of FIG. 16 may be omitted or changed, or other constituent elements may be added.

The oscillation circuit 12 supplies a clock pulse to the respective units as well as the CPU 320 (not shown). For example, the clock pulse may be an oscillation signal from the oscillation circuit 12 connected to the crystal resonator 26. The electronic apparatus 300 may include a vibrating device 10 (an oscillator packaged with necessary circuits and components) including the oscillation circuit 12, instead of the oscillation circuit 12.

The CPU 320 performs various kinds of computation processing or control processing using the clock pulse output from the oscillation circuit 12 in accordance with a program stored in the ROM 340 or the like. Specifically, the CPU 320 performs various kinds of processing according to an operation signal from the operating unit 330, processing for controlling the communication unit 360 so as to perform data communication with the outside, processing for transmitting a display signal so as to display various kinds of information on the display unit 370, processing for outputting various kinds of sound from the sound output unit 380, and the like.

The operating unit 330 is an input device which has operating keys, button switches, or the like, and outputs an operation signal according to user's operation to the CPU 320.

The ROM 340 stores a program for performing various kinds of computation processing or control processing in the CPU 320, data, and the like.

The RAM 350 is used as a work area of the CPU 320, and temporarily stores the program or data read from the ROM 340, data input from the operating unit 330, computation results executed by the CPU 320 in accordance with various programs, and the like.

The communication unit 360 performs various kinds of control to establish data communication between the CPU 320 and an external device.

The display unit 370 is a display device which has a liquid crystal display (LCD) or the like, and displays various kinds of information on the basis of a display signal input from the CPU 320.

The sound output unit 380 is a device, such as a speaker, which outputs output sound.

As described above, in the oscillation circuit 12, it is possible to expand of the variable width of capacitance while securing linearity of the variable capacitive elements, and to suppress an increase in circuit scale and power consumption. For this reason, the electronic apparatus 300 of this application example can obtain a clock pulse having a necessary frequency variable width from the oscillation circuit 12. It is also possible to realize the electronic apparatus 300 which is compact and has low power consumption.

As the electronic apparatus 300, various electronic apparatuses are considered. For example, a personal computer (for example, a mobile personal computer, a laptop personal computer, or a tablet personal computer), a moving object terminal, such as a mobile phone, a digital still camera, an ink jet ejection apparatus (for example, an ink jet printer), a storage area network instrument, such as a router or a switch, a local area network instrument, a television, a video camera, a video recorder, a car navigation system, a pager, an electronic organizer (including one with a communication function), an electronic dictionary, an electronic calculator, an electronic game machine, a game controller, a word processor, a work station, a video phone, a security television monitor, electronic binoculars, a POS terminal, a medical instrument (for example, an electronic thermometer, a sphygmomanometer, a blood glucose meter, an electrocardiographic measurement apparatus, an ultrasonic diagnosis apparatus, or an electronic endoscope), a fish finder, various measurement instruments, meters (for example, meters of a vehicle, an aircraft, and a vessel), a flight simulator, a head-mounted display, motion trace, motion tracking, a motion controller, pedestrian dead reckoning (PDR), and the like may be exemplified.

Figure 17:
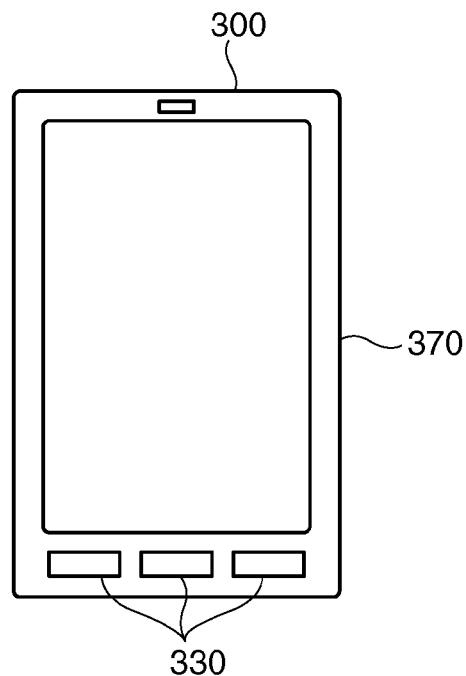
FIG. 17 is a diagram showing an example of the appearance of the electronic apparatus of the application example.

FIG. 17 is a diagram showing an example of the appearance of a smart phone which is an example of the electronic apparatus 300. The smart phone as the electronic apparatus 300 includes buttons as the operating unit 330 and an LCD as the display unit 370. The smart phone as the electronic apparatus 300 uses the oscillation circuit 12, thereby achieving compactness and suppressed power consumption.

3.2. Moving object

A moving object 400 which is an application example to the first embodiment, the second embodiment, and the modifications thereof will be described referring to FIG. 18.

Figure 18:
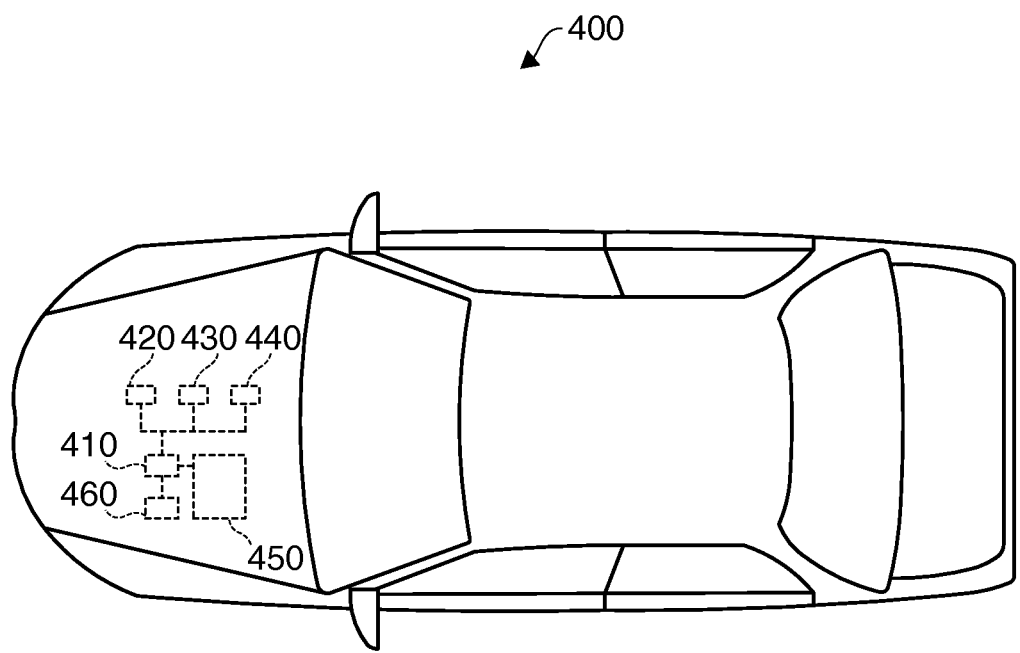
FIG. 18 is a diagram showing an example of a moving object of an application example.

FIG. 18 is a diagram (top view) showing an example of a moving object of this embodiment. The moving object 400 shown in FIG. 18 includes an oscillation circuit 410, controllers 420, 430, and 440 which perform various kinds of control of an engine system, a brake system, a keyless entry system, and the like, a battery 450, and a backup battery 460. In the moving object of this embodiment, some of the constituent elements (respective units) of FIG. 18 may be omitted or changed, or other constituent elements may be added.

The oscillation circuit 410 corresponds to the oscillation circuit 12 of the first embodiment, the second embodiment, or the modification thereof. The oscillation circuit 410 may be an oscillator including the oscillation circuit 12. While detailed description of other constituent elements are omitted, high reliability is required so as to perform control necessary for movement of the moving object. For example, in addition to the battery 450, the backup battery 460 is provided so as to increase reliability.

A clock pulse output from the oscillation circuit 410 should have a predetermined frequency without being affected by environmental changes, such as temperature. For this reason, the oscillation circuit 410 may be, for example, the oscillation circuit 12 (see FIG. 11) of the second embodiment.

At this time, in the oscillation circuit 410, it is possible to expand the variable width of capacitance while securing linearity of change in capacitance of the variable capacitive elements, and to suppress an increase in circuit scale and power consumption. For this reason, the system of the moving object 400 of this application example can obtain a clock pulse having a frequency variable width capable of coping with environmental change, such as temperature, from the oscillation circuit 410. For this reason, it is possible to secure reliability and to avoid an increase in size or power consumption.

As the moving object 400, various moving objects are considered, and for example, a vehicle (including an electric vehicle), an aircraft, such as a jet aircraft or a helicopter, a vessel, a rocket, an artificial satellite, or the like may be exemplified.

4. Others

The oscillation circuit 12 may be formed on a substrate using electronic components, or may be implemented in the form of an integrated circuit (IC) and provided as a semiconductor integrated circuit device. Since the oscillation circuit 12 is an electronic component in the form of a single chip, user friendliness is achieved. A portion excluding a portion corresponding to the amplification element (in the foregoing embodiment, the inverter 25 including the feedback resistor 28) may be implemented in the form of an IC. At this time, the vibrating device 10 (for example, an oscillator) can be formed only through connection to a resonator element (in the foregoing embodiment, the crystal resonator 26), and thus user friendliness is further achieved. The oscillation circuit 12 and the oscillator may be packaged as the vibrating device 10 and provided as a single electronic component.

The invention includes substantially has the same configuration (for example, a configuration having the same functions, methods, and results, or a configuration having the same objects and effects) as the configuration described in the foregoing embodiments and the modifications. The invention includes a configuration in which a non-essential portion in the configuration described in the embodiment or the like is substituted. The invention includes a configuration in which the same functional effects as the configuration described in the embodiment or the like are obtained, or a configuration in which the same objects can be attained. The invention includes a configuration in which the known technique is added to the configuration described in the embodiment or the like.

The entire disclosure of Japanese Patent Application No. 2012-215932, filed Sep. 28, 2012 is expressly incorporated by reference herein.

What is claimed is:

1. An oscillation circuit which is connected to a resonator element and oscillates the resonator element to output an oscillation signal, the oscillation circuit comprising:
    an amplification element; and
    a set of variable capacitive elements having at least two variable capacitive elements, which are connected to an oscillation loop from an output to an input of the amplification element and the capacitance values of which are controlled with potential differences between reference voltages and a variable control voltage, wherein, in each variable capacitive element of the set of variable capacitive elements, the common control voltage is applied to one terminal, and the reference voltage which differs between the variable capacitive elements is applied to the other terminal, and wherein the oscillation circuit has a function of adjusting the reference voltages.

2. The oscillation circuit according to claim 1,
wherein the variable capacitive elements include a MOS variable capacitive element.

3. The oscillation circuit according to claim 1, comprising a plurality of sets of variable capacitive elements, and the control voltage differs between the sets of variable capacitive elements.

4. The oscillation circuit according to claim 3,
wherein at least one set of variable capacitive elements from among a plurality of sets of variable capacitive elements is a set of minimum sensitivity variable capacitive elements having smallest change in capacitance with respect to change in voltage compared to other sets of variable capacitive element.

5. The oscillation circuit according to claim 4,
wherein the control voltage has a group of three kinds of voltages, and
an intermediate voltage between the reference voltages of other sets of variable capacitive elements is used as the control voltage of the set of minimum sensitivity variable capacitive elements.

6. An electronic apparatus comprising:
the oscillation circuit according to claim 1.

7. An electronic apparatus comprising:
the oscillation circuit according to claim 2.

8. A moving object comprising:
the oscillation circuit according to claim 1.

9. A moving object comprising:
the oscillation circuit according to claim 2.

* * * * *